United States Patent [19]

Beauregard et al.

[11] Patent Number: 5,036,584
[45] Date of Patent: Aug. 6, 1991

[54] METHOD OF MANUFACTURE OF COPPER CORED ENCLOSURES FOR HYBRID CIRCUITS

[75] Inventors: Robert E. Beauregard, Lincoln; Joseph M. Gondusky, Warwick, both of R.I.; Henry F. Breit, Attleboro, Mass.

[73] Assignee: Texas Instruments Incorporated, Dallas, Tex.

[21] Appl. No.: 365,631

[22] Filed: Jun. 13, 1989

[51] Int. Cl.⁵ .............................................. H01R 43/00
[52] U.S. Cl. ...................................... 29/884; 228/254; 357/74; 357/80; 437/180; 437/209
[58] Field of Search ................... 29/884, 825; 357/74, 357/80; 437/180, 209

[56] References Cited

U.S. PATENT DOCUMENTS

| | | | |
|---|---|---|---|
| 3,793,064 | 2/1974 | Budd et al. | 437/209 X |
| 4,048,670 | 9/1977 | Eysermans | 357/80 X |
| 4,328,921 | 5/1982 | Liang | 228/254 X |
| 4,483,067 | 7/1984 | Parmentier | 437/209 X |
| 4,640,436 | 2/1987 | Miyoshi et al. | 437/209 X |
| 4,680,618 | 7/1987 | Kuroda et al. | 357/74 |
| 4,763,407 | 8/1988 | Abe | 357/74 X |

FOREIGN PATENT DOCUMENTS 60-211244  11/1985  Japan .................................. 437/180

Primary Examiner—Carl J. Arbes
Attorney, Agent, or Firm—James P. McAndrews; John A. Haug; Melvin Sharp

[57] ABSTRACT

A method of forming an enclosure for an electric circuit and the enclosure wherein there is provided a boat of material having a bottom and side wall, placing a material having a substantially higher thermal conductivity and a lower melting point than that of the boat in the boat bottom, heating the material to a temperature above the melting point thereof and below the melting point of the boat to cause the material to flow along the bottom to form a layer of the material thereon and join the layer to the bottom and side wall and removing a sufficient amount of the bottom of said boat to expose the layer. In accordance with a second embodiment, a depression is formed in the bottom, and when the material flows along the bottom, it fills the depression and become joined to the bottom. Plural such depressions can be provided. The exterior portion of the bottom is removed to expose the material if the depressions do not extend completely through the bottom. In accordance with a third embodiment, a block of metal with a hole therethrough is provided, and filled with a material having a higher thermal conductivity than the block of metal and a melting point below that of the block of metal. The block of metal with material therein is heated to a temperature between the melting point of the material and the block of metal to fill the hole with the metal and join the metal to the block of material. The block is formed into plural smaller blocks and a side wall and a cover are formed around the filled hole.

32 Claims, 2 Drawing Sheets

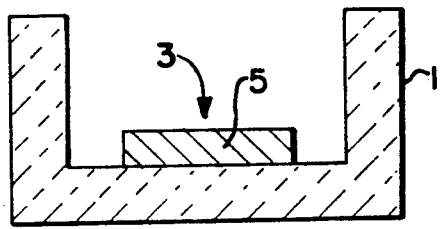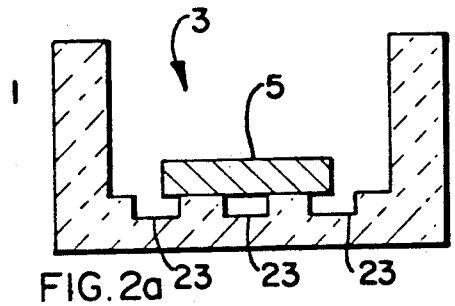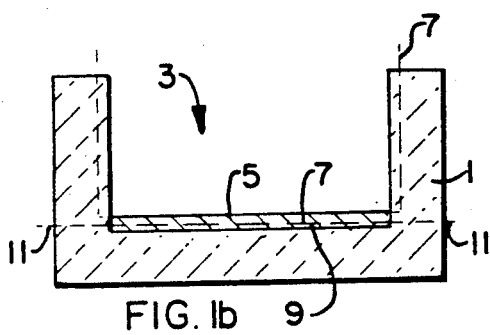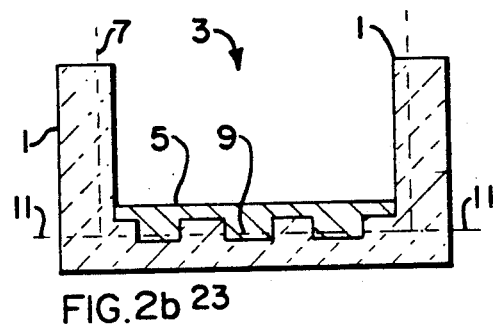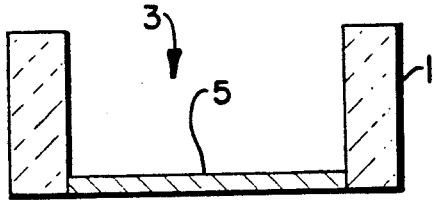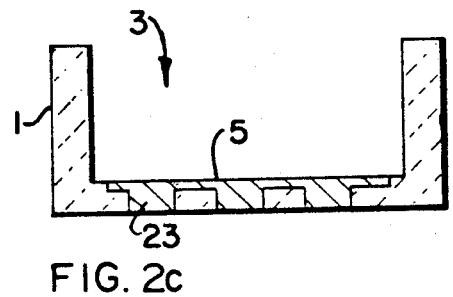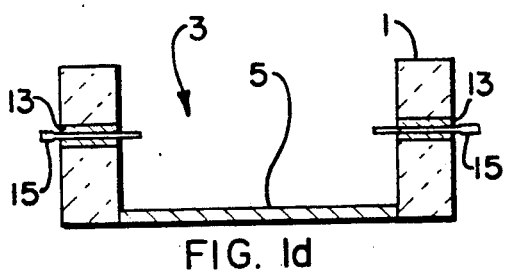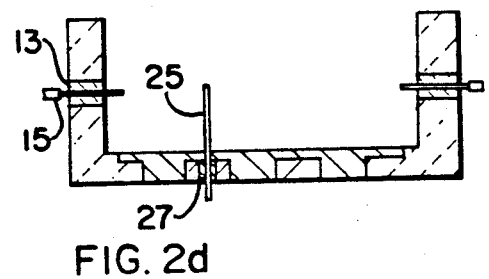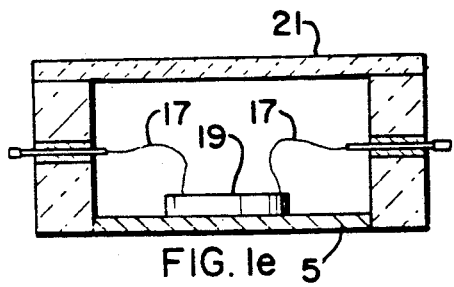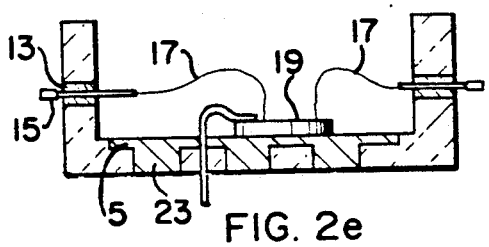

5,036,584

METHOD OF MANUFACTURE OF COPPER CORED ENCLOSURES FOR HYBRID CIRCUITS

BACKGROUND OF THE INVENTION

1. Field of the Invention

This invention relates to enclosures for hybrid circuits and methods of manufacture of such enclosures.

2. Brief Description of the Prior Art

Hybrid electrical circuits, especially such circuits of the chip and wire hybrid type, require the protection of a sealed package or enclosure. The function of the hybrid circuit enclosure is to house and protect a ceramic hybrid circuit, either thick-film or thin-film, by providing a hermetically sealed environment for such circuit. The standard enclosures of the above noted type are fabricated from solid metal (i.e., Kovar, metal alloy ASTM F-15 and the like) which is preferred for glass (low expansion) sealing of insulated through-wall electrical connection leads. Several fabrication methods have been used, these including machining of a boat from a solid block of metal, brazing metal walls to a metal base and stamping of the boat shape from the metal being used. Holes are then punched or drilled in the bottom and/or side walls for vertical and/or horizontal pin-outs, as required. Glass is then used in the holes in conjunction with the kovar conductor pins or leads to hermetically seal the leads in the walls of the enclosure after heating to an appropriate temperature.

The prior art of hybrid electric circuit packages and enclosures is set forth in detail in "Power Hybrids Aid HF Supply Design", by Dennis Buchenholz, PCIM, October, 1988, pages 68 to 70, "Hybrid Packages Maximize Circuit Protection" by Howard W. Markstein, Electronic Packaging & Production, January 1989, pages 48 to 51 and "Designing Power Hybrid Packages" by Al Krum, Hybrid Circuit Technology, March, 1989, pages 17 to 24.

The enclosure must also offer efficient heat dissipation, hermeticity minimum size and a reliable means of connection to an external device, such as a printed circuit board.

As is readily apparent from the prior art, when high power devices are mounted inside the hybrid enclosures or packages, either directly on the package material or on a substrate between the device and the enclosure, a high thermal conductivity enclosure material is required to dissipate the heat generated by the electrical circuit. It is also required that this material have a low coefficient of thermal expansion to avoid cracking or other damage to the electrical circuit.

One standard solution to this problem in the past has been to utilize a kovar ring and braze it to a specialty material i.e., molybdenum, copper-tungsten, copper-molybdenum-copper, clad sheet materials, etc.) which is used as the base material onto which the electrical circuit is affixed.

The above described solution has several disadvantages, among them being high cost of the solid base specialty material, the difficulty in brazing of joints of dissimilar metals (i.e., molybdenum to copper) and the requirement that the leads or pins be confined to the kovar sidewalls of the enclosure in order to maintain hermeticity in conjunction with the glass seal.

It is generally known that an effective hybrid enclosure must have a base which displays high thermal conductivity to transfer heat from the electrical hybrid circuit which is secured thereto to the enclosure exterior through the bottom. It is also highly desirable that the enclosure base simultaneously have a controlled, preferably low, coefficient of thermal expansion which matches the coefficient of thermal expansion of the substrate (usually a ceramic material) of the hybrid circuit to be secured within the enclosure. This prevents or minimizes cracking of the substrate of the hybrid circuit due to thermal cycling or thermal shock. It is further desirable that the lid for the enclosure be hermetically weldable to the sidewalls thereof, generally such as by seam welding or other techniques. This is difficult with, for example, copper sidewalls. A still further desirable feature is that there be matched seals as opposed to compression seals to provide the required hermeticity wherein the expansion properties of the glass sealant is matched to the metal forming the enclosure portion where the seal is to be formed. Kovar is the desired material for thermal matching with glass sealant. A yet further desired property is flexural strength of the base of the enclosure to minimize bowing thereof and thereby minimizing the likelihood of the electrical circuit substrate separating from the base or cracking and decreasing thermal conductivity between substrate and base. A still further consideration is economics which is always present. It is therefore readily apparent that the materials of choice, if displaying the required properties, are copper, steel, aluminum and the like which are relatively inexpensive. A yet further consideration is the ability to provide leads or pins through the enclosure both vertically and horizontally. This requires that all surfaces of the enclosure which will retain such leads or pins have the property of sealing hermetically to the bonding material, generally glass. The prior art has long sought but has been unable to provide enclosures for hybrid electrical circuits which meet all of the above criteria.

SUMMARY OF THE INVENTION

In accordance with the present invention, there is provided an enclosure for hybrid electrical circuits and a method of making same which embodies the above noted criteria.

Briefly, in accordance with a first embodiment of the invention, a solid block of kovar is machined into a boat shape as in the prior art and a hole of predetermined shape and dimension is then cut either partially through or entirely through the base of the boat. A piece of copper is then placed in the aperture, the boat and copper are placed in a furnace under a protective and/or reducing atmosphere and the furnace is then heated to or above the melting point of the copper and below the melting point of the kovar. The copper will flow to fill the aperture and self-braze or wet to the kovar in contact therewith. Any copper in excess of the volume of the aperture will flow over the inner surface of the boat and also self-braze or wet thereto. Any copper not in the aperture can then be machined away entirely or in part to provide a kovar boat with a copper slug portion in the base thereof which is self-brazed or wetted to the kovar. In the event the copper does not extend entirely through the base of the kovar boat, the bottom portion of the boat is machined away until the copper portion extends to and is exposed at the bottom portion of the boat. High reliability glass to metal seals can then be place through either or both of the sidewalls and kovar portion of the bottom for hermetic retention of pins or the like by melting the glass at about 1000° C., this being below the melting point of copper. The package can then be plated with nickel and/or gold to provide the completed package without a top. After the hybrid electrical circuit is secured to the base of the enclosure and wires connected between the pins in the enclosure walls and the electrical circuit, a kovar top is secured to the kovar side walls in standard manner using welding or soldering.

It is noted that the copper is completely surrounded by kovar which is flexurally strong and that the kovar prevents the copper from expanding to the degree it would if not surrounded by the kovar. This property of the copper is further improved by providing many small apertures in the kovar base for receiving the copper rather than one large aperture as discussed hereinabove.

BRIEF DESCRIPTION OF THE DRAWINGS

FIGS. 1a to 1e depict the process steps required to form an enclosure in accordance with a first embodiment of the present invention;

FIGS. 2a to 2e depict the process steps required to form an enclosure in accordance with a second embodiment of the present invention;

DESCRIPTION OF THE PREFERRED EMBODIMENTS

Figure 3:
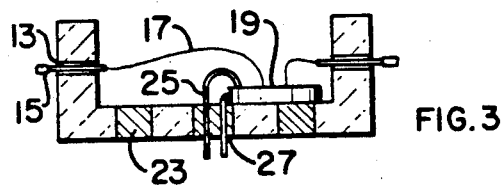
FIG. 3 is a diagram of an enclosure in accordance with a third embodiment of the present invention.
Figure 4A:
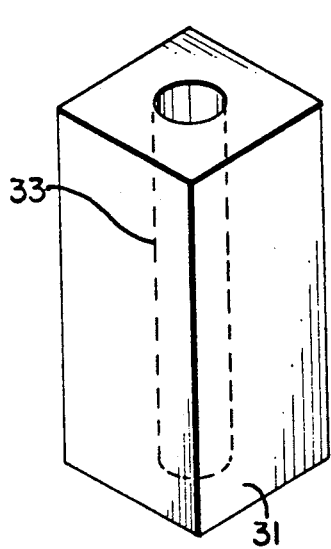
FIGS. 4a to 4d depict the process steps required to form an enclosure in accordance with a fourth embodiment of the present invention.
Figure 4B:
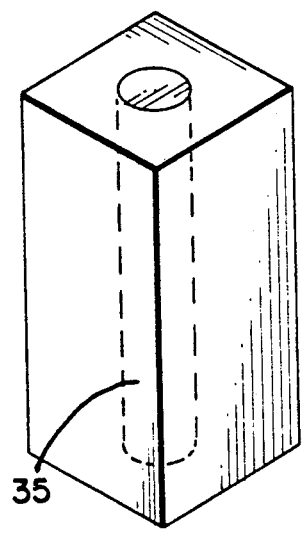
Figure 4C:
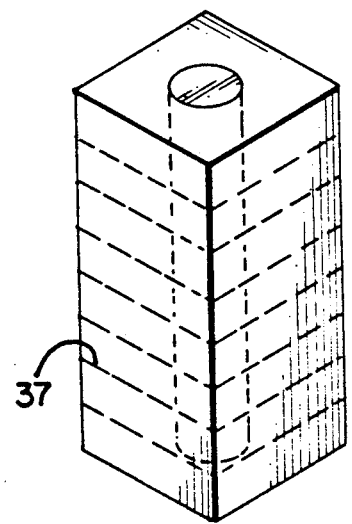
Figure 4D:
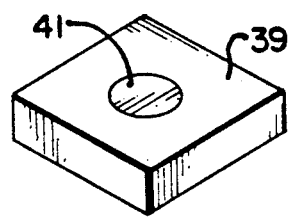

Referring first to FIGS. 1a to 1e, there is shown a first embodiment in accordance with the present invention.

As shown in FIG. 1a, a solid block of kovar is machined into a boat shape 1 as in the prior art and a hole or aperture 3 of predetermined shape and dimension is then cut either partially through or entirely through the base of the boat. A piece of copper 5 in the form of a slug or the like is then placed in the aperture 3, the boat 1 with copper therein are placed in a furnace under a protective atmosphere of dry nitrogen and the furnace is then heated to or above the melting point of the copper which is 1047 degrees C. and below the melting point of the kovar which is 1450 degrees C. As shown in FIG. 1b, the copper 5 will then flow to fill the aperture and self-braze or wet to the kovar in contact therewith. The copper is then cooled and is cast in place. The kovar portion of the boat is then machined around the aperture 3 along the vertical lines 7 to below the top surface of the copper and the copper is then machined away along the horizontal line 9 to provide a clean copper surface within the boat. The kovar boat 1 is also machined along the horizontal line 11 to expose a region of copper at the bottom of the boat as shown in FIG. 1c. High reliability glass to metal seals 13 are then placed through either or both of the sidewalls and kovar portion of the bottom of the boat 1 for hermetic retention of pins 15 or the like by melting the glass at about 1000 degrees C., this being below the melting point of copper as shown in FIG. 1d. The package can then be plated with nickel and/or gold to provide the completed package without a top. After the hybrid electrical circuit is secured to the base of the enclosure and wires 17 connected between the pins in the enclosure walls and the hybrid electrical circuit 19, a kovar top 21 is secured tot he kovar side walls in standard manner using welding or soldering.

Referring now to FIGS. 2a to 2e, there is shown a second embodiment of the invention wherein like reference numbers refer to like parts as in FIG. 1. In this embodiment, the procedure is as in FIG. 1 except that plural apertures 23 are formed in the bottom of the aperture 3 prior to introduction of the copper slug 5 as shown in FIG. 2a. Accordingly, upon heating to the melting point of the copper or above, the apertures 23 as well as a portion of the boat interior above the apertures 23 is filled with the melted and later solidified copper as shown in FIG. 2b. Machining then takes place along the vertical line 7 and the horizontal line 9. However, when machining then takes place along the line 11, plural smaller sections of copper are exposed in the apertures 23 between the kovar sections as shown in FIG. 2c. In this embodiment, since kovar is present in portion of the boat bottom, a pin 25 with hermetic seal 27 identical to those in the sidewalls can also be placed through the bottom as shown in FIG. 2d. Accordingly, as shown in FIG. 2e, connection is made from the electrical circuit 19 to all of the pins 15 and 25.

As a still further embodiment, the embodiment of FIG. 2a to 2e is altered by providing one or more apertures 23 and then machining along the horizontal line 9 wherein the horizontal line 9 is disposed so that it passes through the aperture or apertures 23. In this manner, all copper 5 is removed from the interior bottom portion of the boat with copper being disposed only in the apertures 23 as shown in FIG. 3.

It should be understood that in the case of each of the embodiments of FIGS. 1 to 3, the sidewall can be of the same or different material from that of the base or bottom with the bottom being joined to the sidewalls as in the prior art. Otherwise, the procedure is the same as described hereinabove.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

We claim:

1. A method of forming an enclosure for electrical circuits comprising the steps of:
   (a) providing a boat of predetermined material having a bottom and side wall,
   (b) placing a material having a thermal conductivity substantially higher than the thermal conductivity of said boat and a melting point lower than the melting point of said boat in the interior of said boat on said bottom,
   (c) heating said material to a temperature above the melting point thereof and below the melting point of said boat to cause said material to flow along said bottom to form a layer of said material thereon and join said layer to said bottom and side wall, and
   (d) removing a sufficient amount of said bottom of said boat to expose said layer.

2. The method of claim 1, further including the steps of forming apertures in said side wall and then hermetically sealing electrical terminals in and extending through said side wall.

3. The method of claim 1 further including the steps of providing a cover of the same material as said side wall and hermetically sealing said cover to said side wall.

4. The method of claim 2 further including the steps of providing a cover of the same material as said side wall and hermetically sealing said cover to said side wall.

5. A method of forming an enclosure for electrical circuits comprising the steps of:
   (a) providing a boat of predetermined material having a bottom and side wall,
   (b) forming a depression in said bottom, and
   (c) placing a material having a thermal conductivity substantially higher than the thermal conductivity of said boat and a melting point lower than the melting point of said boat in the interior of said boat on said bottom,
   (d) heating said material to a temperature above the melting point thereof and below the melting point of said boat to cause said material to flow along said bottom, fill said depression and become joined to said bottom.

6. The method of claim 5 wherein said depression extends entirely through said bottom.

7. The method of claim 5, further including the step of removing a sufficient amount of said bottom of said boat to expose said material.

8. The method of claim 6 further including the step of removing a predetermined amount of said material in the interior of said boat so that all of said material is in said depression.

9. The method of claim 5 further including the step of forming a plurality of depressions and causing said material to fill said depressions.

10. The method of claim 9 wherein said depressions extend entirely through said bottom.

11. The method of claim 9, further including the step of removing a sufficient amount of said bottom of said boat to expose said material.

12. The method of claim 10 further including the step of removing a predetermined amount of said material in the interior of said boat so that all of said material is in said depressions.

13. The method of claim 5, further including the steps of forming apertures in said side wall and in a portion of said bottom other than of said material and then hermetically sealing electrical terminals in and extending through said side wall and said bottom.

14. The method of claim 5 further including the steps of providing a cover of the same material as said side wall and hermetically sealing said cover to said side wall.

15. The method of claim 13 wherein said depression extends entirely through said bottom.

16. The method of claim 14 wherein said depression extends entirely through said bottom.

17. The method of claim 13, further including the step of removing a sufficient amount of said bottom of said boat to expose said material.

18. The method of claim 14, further including the step of removing a sufficient amount of said bottom of said boat to expose said material.

19. The method of claim 13 further including the step of removing a predetermined amount of said material in the interior of said boat so that all of said material is in said depression.

20. The method of claim 14 further including the step of removing a predetermined amount of said material in the interior of said boat so that all of said material is in said depression.

21. The method of claim 13 further including the step of forming a plurality of depressions and causing said material to fill all of said depressions.

22. The method of claim 14 further including the step of forming a plurality of depressions and causing said material to fill all of said depressions.

23. The method of claim 21 wherein said depressions extend entirely through said bottom.

24. The method of claim 22 wherein said depressions extend entirely through said bottom.

25. The method of claim 13, further including the step of removing a sufficient amount of said bottom of said boat to expose said material.

26. The method of claim 21 further including the step of removing a predetermined amount of said material in the interior of said boat so that all of said material is in said depressions.

27. The method of claim 22 further including the step of removing a predetermined amount of said material in the interior of said boat so that all of said material is in said depressions.

28. The method of claim 13 wherein said electrical terminals are hermetically sealed in said bottom.

29. A method of forming an enclosure for electrical circuits, comprising the steps of:
   (a) providing a block of metal of predetermined melting point and thermal coefficient of expansion;
   (b) forming a hole extending through said block of metal;
   (c) filling said hole with a material having a thermal conductivity substantially higher than said block of metal and a melting point below that of said block of metal;
   (d) heating said block of metal with material therein to a temperature between the melting point of said material and said block of metal to fill said hole with said metal and join said metal to said block of material;
   (e) forming said block of step (d) into plural smaller blocks with said filled hole extending through the central region of each said smaller block; and
   (f) forming a side wall and a cover around said filled hole.

30. The method of claim 29 wherein said block of metal is kovar and said material is copper.

31. The method of claim 29 further including the steps of forming hermetically sealed electrical terminals in and extending through at least one of said side wall and said block of metal.

32. The method of claim 30 further including the steps of forming hermetically sealed electrical terminals in and extending through at least one of said side wall and said block of metal.

* * * * *